US010685931B2

(12) United States Patent
Bahl et al.

(10) Patent No.: US 10,685,931 B2
(45) Date of Patent: *Jun. 16, 2020

(54) METHOD AND APPARATUS FOR FORMING CONTACTS ON AN INTEGRATED CIRCUIT DIE USING A CATALYTIC ADHESIVE

(71) Applicant: CATLAM, LLC, Sunnyvale, CA (US)

(72) Inventors: Kenneth S. Bahl, Saratoga, CA (US); Konstantine Karavakis, Pleasanton, CA (US)

(73) Assignee: CATLAM LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/889,017

(22) Filed: Feb. 5, 2018

(65) Prior Publication Data

US 2018/0158793 A1 Jun. 7, 2018

Related U.S. Application Data

(63) Continuation of application No. 15/350,019, filed on Nov. 12, 2016, now Pat. No. 9,922,951.

(51) Int. Cl.
*H01L 23/00* (2006.01)
*H01L 21/56* (2006.01)
(Continued)

(52) U.S. Cl.
CPC .......... *H01L 24/29* (2013.01); *C23C 18/1608* (2013.01); *C23C 18/1612* (2013.01);
(Continued)

(58) Field of Classification Search
CPC ....... H01L 24/29; H01L 21/563; H01L 24/83; H01L 24/27; H01L 24/06; H01L 21/486; H01L 23/49894; H01L 23/2224; H01L 23/27464; H01L 2224/29553; H01L 2224/83678; H01L 2224/83647;
(Continued)

(56) References Cited

U.S. PATENT DOCUMENTS 3,269,891 A 8/1966 Schneble et al.
3,546,009 A 12/1970 Schneble et al.
(Continued)

FOREIGN PATENT DOCUMENTS

EP 1 367 872 12/2003
WO 2009 006010 A2 1/2009
WO 2012 127205 9/2012

*Primary Examiner* — Victor A Mandala
(74) *Attorney, Agent, or Firm* — File-EE-Patents.com; Jay A. Chesavage

(57) ABSTRACT

A catalytic laminate is formed from a resin, a fiber reinforced layer, and catalytic particles such that the catalytic particles are disposed throughout the catalytic laminate but excluded from the outer surface of the catalytic laminate. The catalytic laminate has trace channels and vias formed to make a single or multi-layer catalytic laminate printed circuit board. Apertures with locations which match the locations of integrated circuit pads are formed in the laminate PCB. The integrated circuit is bonded to the catalytic laminate PCB, and the integrated circuit and laminate are both subjected to electroless plating, thereby electrically connecting the integrated circuit to the single or multi-layer catalytic laminate PCB.

17 Claims, 9 Drawing Sheets

(51) Int. Cl.
*H01L 23/498* (2006.01)
*C23C 18/16* (2006.01)
*H01L 21/48* (2006.01)
*H01L 23/14* (2006.01)
*C23C 18/20* (2006.01)
*H05K 3/18* (2006.01)
*H05K 3/32* (2006.01)
*H05K 3/42* (2006.01)
*C23C 18/38* (2006.01)

(52) U.S. Cl.
CPC ........ *C23C 18/1641* (2013.01); *C23C 18/204* (2013.01); *C23C 18/38* (2013.01); *H01L 21/4846* (2013.01); *H01L 21/563* (2013.01); *H01L 23/145* (2013.01); *H01L 23/49894* (2013.01); *H01L 24/06* (2013.01); *H01L 24/24* (2013.01); *H01L 24/27* (2013.01); *H01L 24/82* (2013.01); *H01L 24/83* (2013.01); *H05K 3/185* (2013.01); *H05K 3/32* (2013.01); *H05K 3/422* (2013.01); *H01L 21/486* (2013.01); *H01L 23/49822* (2013.01); *H01L 23/49827* (2013.01); *H01L 2224/04105* (2013.01); *H01L 2224/12105* (2013.01); *H01L 2224/16225* (2013.01); *H01L 2224/27464* (2013.01); *H01L 2224/29147* (2013.01); *H01L 2224/29553* (2013.01); *H01L 2224/48091* (2013.01); *H01L 2224/48227* (2013.01); *H01L 2224/83639* (2013.01); *H01L 2224/83644* (2013.01); *H01L 2224/83647* (2013.01); *H01L 2224/83655* (2013.01); *H01L 2224/83657* (2013.01); *H01L 2224/83678* (2013.01); *H01L 2224/92144* (2013.01); *H01L 2924/15311* (2013.01); *H01L 2924/181* (2013.01)

(58) Field of Classification Search
CPC ... H01L 2224/83639; H01L 2224/2224; H01L 2224/83657; H01L 2224/83655; H01L 2224/29147; H01L 2224/83644; H01L 24/24; H01L 23/145; H01L 21/4846; H01L 24/82; H01L 2224/12105; H01L 2924/181; H01L 2224/48091; H01L 2224/04105; H01L 2224/92144; H01L 2224/16225; H01L 23/49822; H01L 23/49827; H01L 2924/15311; H01L 2224/48227; H01L 2224/27464; H01L 2924/00014; H01L 2924/00012; H05K 3/422; H05K 3/32; H05K 3/185; C23C 18/204; C23C 18/1641; C23C 18/1612; C23C 18/1608; C23C 18/38

See application file for complete search history.

(56) References Cited

U.S. PATENT DOCUMENTS

| | | | |
|---|---|---|---|
| 3,907,621 A * | 9/1975 | Polichette | C23C 18/26 216/17 |
| 3,925,138 A | 12/1975 | Shaul et al. | |
| 4,001,466 A | 1/1977 | Schaul et al. | |
| 4,167,601 A | 9/1979 | Beckenbaugh et al. | |
| 4,287,253 A | 1/1981 | Leech | |
| 4,354,895 A | 10/1982 | Ellis | |
| 4,360,570 A * | 11/1982 | Andreades | G03F 7/168 428/131 |
| 4,457,952 A | 7/1984 | Kawamoto et al. | |
| 4,585,502 A | 4/1986 | Uozu et al. | |
| 4,859,571 A | 8/1989 | Cohen et al. | |
| 5,162,144 A | 11/1992 | Brown et al. | |
| 5,260,170 A | 11/1993 | Brown | |
| 5,371,654 A | 6/1994 | Beaman | |
| 6,696,173 B1 | 2/2004 | Naundorf et al. | |
| 7,334,326 B1 | 2/2008 | Kluemoeller et al. | |
| 7,632,753 B1 | 12/2009 | Rush et al. | |
| 7,752,752 B1 | 7/2010 | Rusli et al. | |
| 8,187,478 B2 | 5/2012 | Liu | |
| 8,784,973 B2 | 7/2014 | Sugimura et al. | |
| 9,706,650 B1 * | 7/2017 | Bahl | H05K 1/0313 |
| 9,922,951 B1 * | 3/2018 | Bahl | C23C 18/1608 |
| 2005/0189136 A1* | 9/2005 | Kawasaki | H01L 23/49811 174/255 |
| 2006/0055021 A1 | 3/2006 | Yamamoto | |
| 2006/0057341 A1 | 3/2006 | Kawabata | |
| 2006/0068173 A1 | 3/2006 | Kajiyama | |
| 2009/0120660 A1 | 5/2009 | Park et al. | |
| 2009/0301997 A1 | 12/2009 | Liu | |
| 2010/0266752 A1 | 10/2010 | Tseng et al. | |
| 2011/0048783 A1 | 3/2011 | Yu et al. | |
| 2012/0074094 A1 | 3/2012 | Chiang | |
| 2014/0231986 A1* | 8/2014 | Dubin | H01L 23/481 257/737 |
| 2015/0334825 A1 | 11/2015 | Karavakis et al. | |
| 2015/0334826 A1 | 11/2015 | Karavakis et al. | |
| 2015/0334836 A1 | 11/2015 | Karavakis et al. | |
| 2016/0135297 A1 | 5/2016 | Karavakis et al. | |
| 2016/0148893 A1 | 5/2016 | Kavakis et al. | |

* cited by examiner

BGA Chip package on PCB (Prior Art)

Chip and BGA Carrier board top view (Prior Art)

Flip Chip with BGA soldered to PCB (Prior Art)

Flip Chip Bottom View (Prior Art)

Wafer Level Packaging

Detail A

Detail A

*Figure 5*
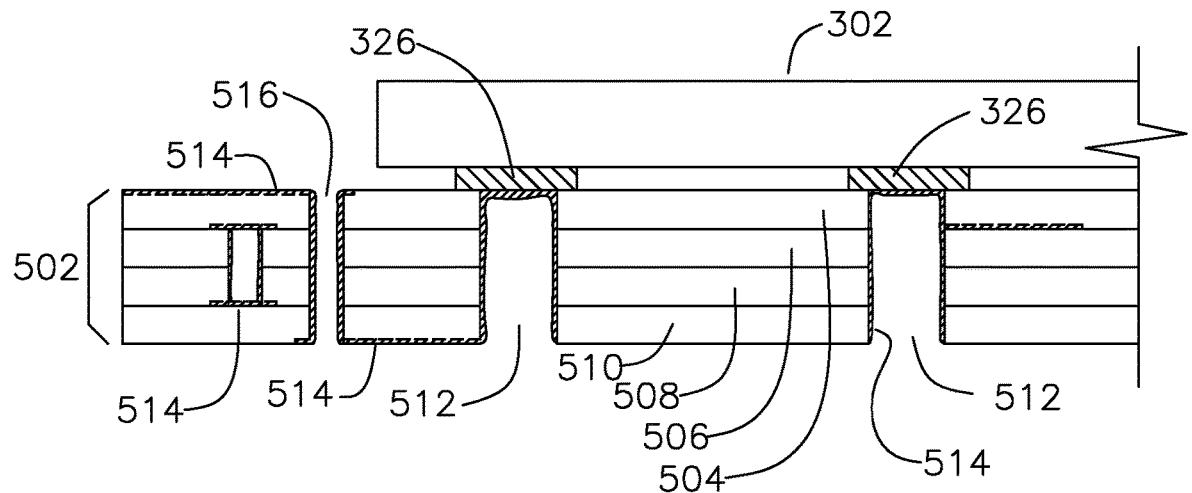
*Figure 6A*
Bottom View
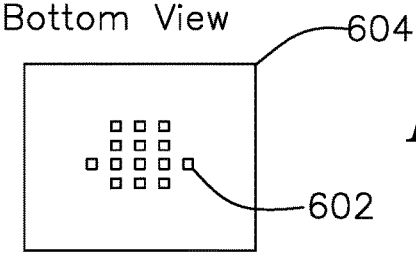
*Figure 6A-1*
Side View
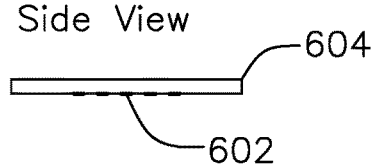
*Figure 6B*
Bottom View
*Figure 6B-1*
Side View
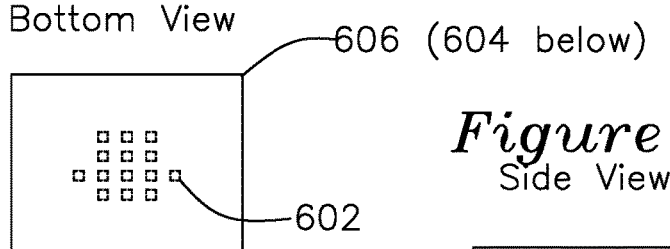

Chip after forming channels in catalytic adhesive
Bottom View

Side View

Side View

Side View

702 — Optionally plate chip lands with transition metals or apply catalytic particles to lands 704 — Apply catalytic adhesive over chip and lands 706 — Remove surface to expose chip clands and form channels 708 — Form traces in channels using electroless deposition 710 — Mask laminate to form terminals 712 — Optionally form bumps on terminals Catalytic Particle Distribution through Prepreg

METHOD AND APPARATUS FOR FORMING CONTACTS ON AN INTEGRATED CIRCUIT DIE USING A CATALYTIC ADHESIVE

The present patent application is a continuation of U.S. patent application Ser. No. 15/350,019 filed Nov. 12, 2016.

FIELD OF THE INVENTION

The present invention relates to integrated circuit packaging and attachment of an integrated circuit to a substrate. In particular, the invention relates to the electrical bonding of an integrated circuit chip or die to a catalytic laminate substrate or catalytic adhesive to form a device assembly.

BACKGROUND OF THE INVENTION

A fundamental consideration for electronic circuits is the interconnection of elements of the circuit. A typical prior art interconnection technology is a printed circuit board (PCB), where conductive traces are printed on a laminate and various components are mounted on the PCB to provide electrical interconnections. One fundamental consideration is that while new generations of integrated circuits continue to offer finer and finer fabrication linewidths (currently on the order of 50 nm), printed circuit board linewidths have remained on the order of 5 mil spacing (~125 u), a factor of 2,500 coarser than integrated circuit linewidths. Accordingly, chip design practice continues to maximize the complexity and functionality of the chip, and minimize the number of input/output (I/O) lines leaving the chip. For chip designs with a large number of I/O connections, adapting the chip I/O pins to the PCB remains an unsolved problem, as chip feature sizes continue to shrink and PCB linewidths have remained unchanged.

FIG. 1A shows a side view of a Ball Grid Array (BGA) package 101 which has been soldered to a printed circuit board 102 having a series of pads which electrically connect to the balls 114 of the BGA package 101. The BGA package 101 comprises the chip 104 which is mounted to a substrate 112 with printed wire bonding pads 110 on top and electrical traces to BGA pads 115 below. Individual wires 108 are bonded, such as by ultrasonic welding, from the pads 106 of the IC 104 to the bonding pads 110 of the substrate 112. The chip 104 may be mechanically attached to the substrate 112 using an adhesive or other technique, with the pads 106 accessible from the top, as shown. After wire bonding of the interconnect wires 108 between the chip 104 pads and substrate 112 pads 110, a sealant 105 such as epoxy is applied to protect the top of the chip. In a secondary operation, individual balls 114 are attached to the bottom pads of the substrate 112 at each attachment point 115, so that during a subsequent operation, they reflow at elevated temperature to form electrical connections to circuit board 102. The substrate 112 may be a conventional printed circuit board which follows typical PCB linewidths of 5 mil (~125 u) wide and 5 mil (~125 u) edge spacing, formed using printed copper traces with a nickel flash or other thin plating over the traces for material compatibility with the die bond wires 108, which may be aluminum, gold, silver, or copper. In a prior art integrated circuit, individual devices are formed into a chip substrate such as silicon (Si) by patterned localized ion implantation to achieve doping to form semiconductor devices, and the semiconductor devices are interconnected using a series of metallic interconnects (metallization layers) formed from aluminum or copper, and optional intervening insulating or barrier layers. The chip interconnect lands (or pads) are typically provided using the same material as the layer metallization, usually using aluminum for low complexity/density chips and copper for high complexity/density chips.

FIG. 1B shows a top view of FIG. 1A, with structures identified using the reference numbers of FIG. 1A, as is done throughout the present patent application.

The prior art system of FIG. 1A is limited by the PCB linewidths which are significantly coarser than the chip linewidths. Additionally, the wire bonding method of FIG. 1A introduces undesirable lead inductance from chip 104 to PCB 102 which limits the high frequency signal propagation ability of the resulting circuit. While it is possible to maintain the high frequency transmission line characteristics of a printed circuit board trace using a reference ground plane, it is not possible to provide such continuous impedance or a continuous ground reference for a bond wire such as 108 which is also inductively coupled to other bond wires, particularly as the switching frequency delivered to the transmission line increases.

One consideration of PCB technology is manufacturability and serviceability, including replacement of individual devices if they are discovered to be defective. In the BGA packaging technology of FIG. 1A, when a chip is defective, localized heat may be applied to the 101 BGA chip assembly until the BGA balls between circuit substrate 112 and PCB 102 melt, after which the BGA chip assembly 101 is removed, and a replacement BGA chip assembly 101 may be installed. Additionally, for high value BGA assemblies 101, it is possible to re-ball (install new solder balls 114) and reattach the BGA package 101 to the PCB 102 using localized heating and solder flux until the balls 114 melt (reflow) onto the pads on adjacent upper and lower surfaces.

To address the low package density and lead inductance of BGA packaging, a "flip chip" packaging method shown in FIG. 2A incorporates an inverted chip substrate 202, with the chip circuits and lands facing downwards compared to the up-facing chip land orientation of the BGA chip package of FIG. 1A. In the flip chip approach, a chip 202 has interconnect lands formed on the bottom surface (typically in copper), and an insulating mask layer 204 prevents migration of the solder balls 208 and electrically isolates the adjacent interconnect layer. Flip chip interconnects involve comparatively high tooling costs and capital equipment costs, and so are commonly used in high volume and high density packaging methods, such as consumer cell phones. FIG. 2B shows the bottom view of a flip chip for comparison with the side view of FIG. 2A.

One problem of the prior art is that BGA chip bonding introduces lead inductance, which is solved in the flip chip method at the expense of high tooling cost and the difficulty of reworking or removing a flip-chip device. Another problem of the prior art packaging is that it may be desired to integrate several chips and circuits onto a PCB for use in an agency-regulated assembly, where the chip module is inspected and certified by a regulatory agency. Examples of such agency-regulated assemblies include Bluetooth® or 802.11 Wireless Local Area Network (WLAN) module where a regulatory agency inspects the module for RF emissions against a published standard, and certifies the module as compliant to that emissions standard. Use of a pre-approved module in this form allows the user of the module to make changes in their interconnected PCB design without the requirement for re-certification, which would be otherwise required if the previously approved design in the pre-approved module were incorporated into their PCB.

The inventors have discovered a high density packaging apparatus and method which provides several factors of finer PCB linewidth than provided by prior art PCB fabrication methods, with minimal incremental tooling cost. Accordingly, is desired to provide a packaging method which enables direct mounting of integrated circuit chips to a circuit board or substrate for low volume cost-sensitive applications, and which provides continuous electrical connections for high speed operation and improved signal integrity, and without inductive wire bonding of the prior art.

OBJECTS OF THE INVENTION

A first object of the invention is a catalytic substrate having a plurality of apertures, the catalytic substrate having a non-catalytic surface and having catalytic particles an exclusion depth below the non-catalytic surface, such that removing the surface material such as by etching, scraping, drilling, or other removal means which form channels or apertures activates (exposes) the underlying catalytic particles, the catalytic particles having a density sufficient to support electroless plating, the apertures positioned adjacent to lead attachments of a semiconductor chip, the channels adjacent to the apertures, such that during electroless plating, the electroless conductive metal deposits onto the exposed catalytic particles, aperture surfaces, and also the chip land attachments, thereby providing electrical connectivity between the chip lands, and substrate channels and apertures.

A second object of the invention is a method for providing electrical connectivity between a semiconductor chip and a substrate, the method operative on a semiconductor chip having electrical attachment pads, and the catalytic substrate having a catalytic core, the catalytic core providing sufficient catalyst density to cause electroless plating of conductive metal onto channels and apertures which have been formed into the catalytic substrate using any method of surface material removal including mechanical or chemical methods, the catalytic substrate not exposing catalytic particles unless a surface has been removed, the method comprising:

forming apertures and optionally trace channels into a catalytic laminate at a depth sufficient to expose catalytic particles;

positioning a semiconductor chip with electrical lands aligned with apertures formed in the catalytic laminate;

immersing the semiconductor chip and substrate into an electroless solution until electroless conductive material is deposited between the semiconductor chip lead attachment and apertures, and optionally the interconnect channels.

SUMMARY OF THE INVENTION

A semiconductor integrated circuit (IC) chip with lead attachment lands (electrically functional input/output, power, and ground pads for the IC) is positioned onto a catalytic laminate which has catalytic particles distributed through the laminate but also has an exclusion zone on the surface with no exposed catalytic particles. The catalytic laminate requires the surface material be removed below a catalytic particle exclusion depth to expose the underlying catalytic particles, using removal means such as chemical or mechanical etching or abrasion or drilling. The removal of surface material exposes the catalytic particles and provides a surface suitable for electroless plating of conductive materials from solution such as copper to form conductive traces. Apertures are formed in the catalytic laminate such as by drilling or punching, the apertures corresponding to chip lands, with optional trace channels formed in the catalytic substrate. Other trace channels, pads, and apertures may support other components, traces, and chips on the catalytic substrate, and the trace channels may be formed on one side, or on both sides of the substrate. An electroless plating step results in conductive traces to form only in the trace channels, apertures, and chip lands (electrical pads) adjacent to the apertures, thereby forming conductor traces and attachments exclusively in the selected regions where the surface of the catalytic laminate has been removed.

In another example of the invention, a semiconductor chip has lands for electrical attachment, the semiconductor chip is coated with a catalytic adhesive on the surfaces with lands, the catalytic adhesive is subsequently cured at a gel point and dwell temperature and dwell time sufficient for catalytic particles in the resin to move below the surface, thereby creating a catalytic adhesive with no exposed catalytic particles on the surface, and with catalytic particles below an exclusion depth of the catalytic adhesive. The cured adhesive has channels formed onto the surface which extend below the exclusion depth, and also has apertures formed which extend to the depth of the lands. In a subsequent electroless copper deposition step, copper is deposited in the regions which have exposed catalytic particles such as the aperture walls and channel walls, and onto the lands, which provide either catalytic particles or a copper plating, either of which will form conductive connections during the electroless copper deposition.

BRIEF DESCRIPTION OF THE DRAWINGS

FIG. 5 shows a multi-layer catalytic laminate board bonded to a chip.

FIGS. 6A, 6B, and 6C show a bottom view of an integrated circuit after application of certain steps of the process.

FIGS. 6A-1, 6B-1, and 6C-1 show side views of FIGS. 6A, 6B, and 6C, respectively.

DETAILED DESCRIPTION OF THE INVENTION

Figure 1A:
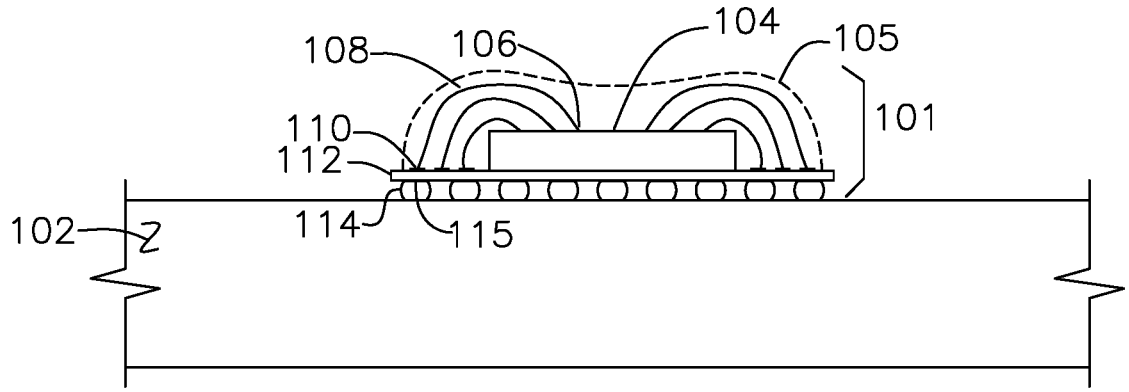
FIG. 1A is a side view of a prior art BGA package soldered to a circuit board.
Figure 1B:
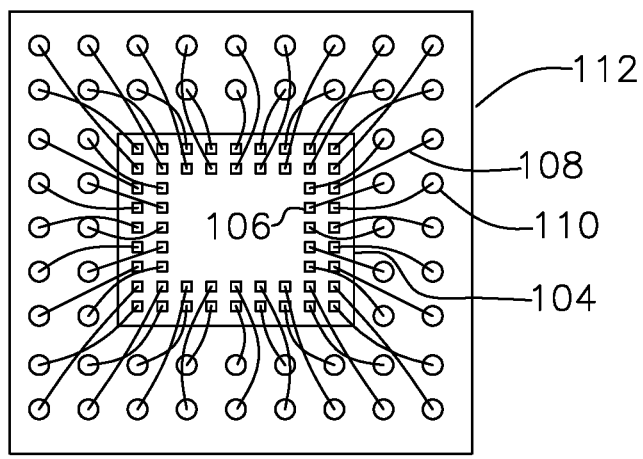
FIG. 1B is a top view of the prior art BGA package of FIG. 1A.
Figure 2A:
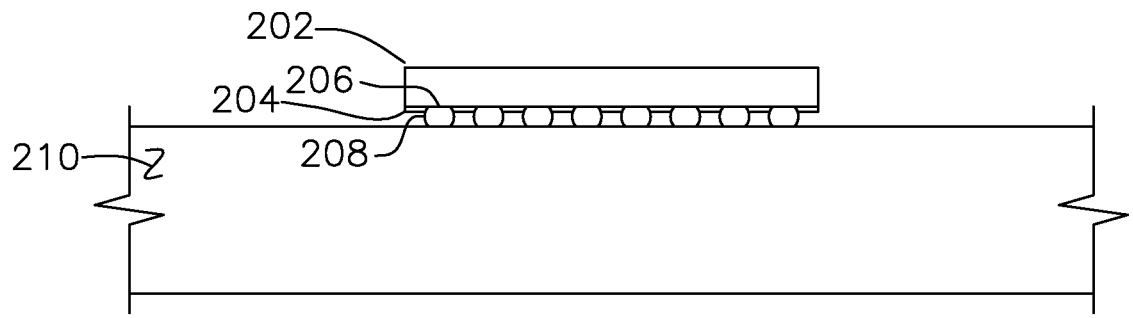
FIG. 2A is a side view of a prior art flip chip soldered to a circuit board.
Figure 2B:
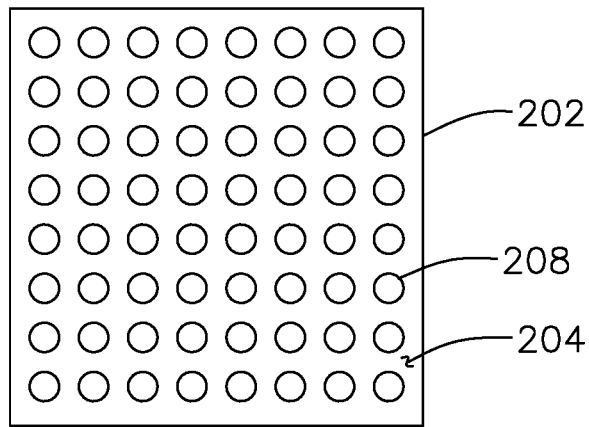
FIG. 2B is a bottom side view of a prior art flip chip with BGA balls.
Figure 3:
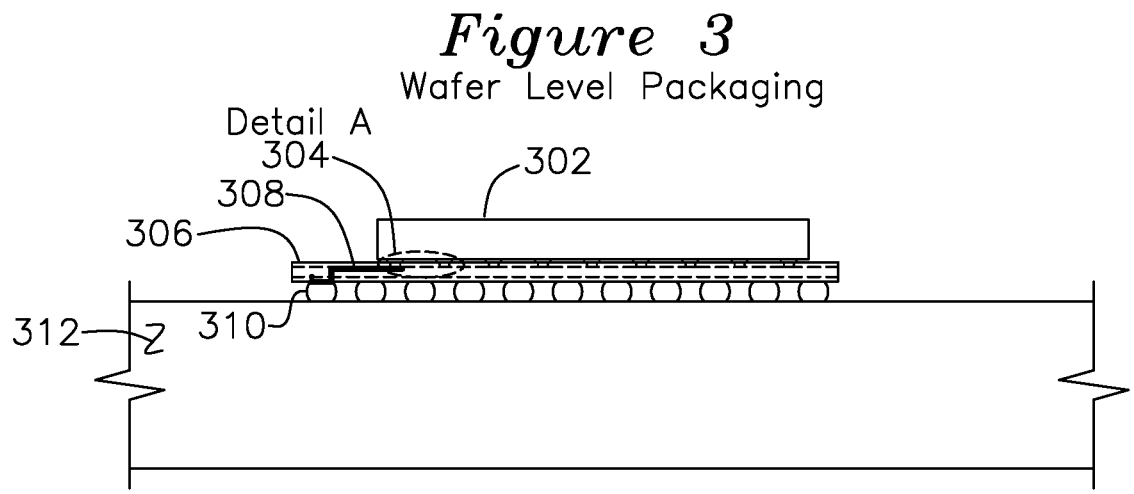
FIG. 3 shows a side view of a chip attached to a substrate, which is attached to a printed circuit board, according to an aspect of the present invention.

FIG. 3 shows an side view diagram of an example of wafer level packaging, where a chip 302 is attached to a substrate 306, the substrate having an example electrical trace (shown in bold) which leads from a an interconnect pad of the chip 302 to a BGA ball 310, which is soldered to a circuit board 312. There are many ways of accomplishing the lead attachment of the present invention, and FIG. 3 is shown only to illustrate one embodiment. Detail A 304 includes the region of interest, showing attachment from a chip 302 to substrate 306 following the attachment step shown in FIGS. 3A and 3B.

Figure 3A:
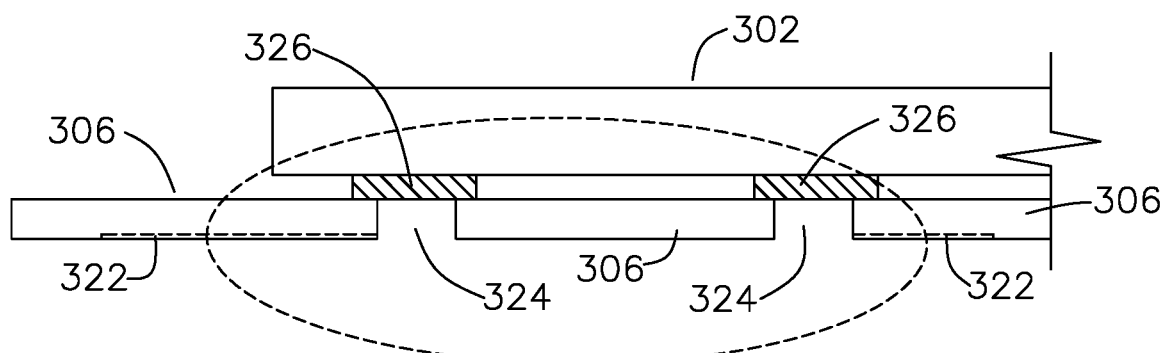
FIG. 3A shows a detail side view of FIG. 3 in a first step of an bonding process.

FIG. 3A shows a detail view of the catalytic substrate 306 and chip 302 with chip attachment pads 326 formed on the chip 302 for electrical connectivity. The chip lands 326 are typically formed during the final metallization step in the fabrication process of chip 302, the thickness of the lead attachment pads is greatly exaggerated vertically to distinguish the lead attachment lands 326 of IC 302 for clarity. The substrate 306 is formed from a catalytic laminate in one of several different ways, but the common characteristic of the various forms of making the substrate is the substrate is a catalytic laminate formed from a mixture of catalytic particles, resin, and a woven or non-woven fabric binder such as fiberglass, where the catalytic laminate has the property of catalytic particles dispersed throughout the laminate but has a surface exclusion depth where no catalytic particles are present. In one example of the invention, the catalytic particles are less then 25 u in longest dimension, and the surface exclusion depth for catalytic particles is approximately one half of the largest dimension of the catalytic particle longest dimension. FIG. 3A shows catalytic laminate 306 which has no exposed surface catalytic particles, except in areas where the surface has been removed below the exclusion depth, such as channels 322 and apertures 324, which expose catalytic particles in these regions. The apertures 324 are positioned to correspond to the chip attachment lands 326, and the chip 302 is affixed to the substrate 306 with the pads 326 and apertures 324 aligned to each other.

Figure 3B:
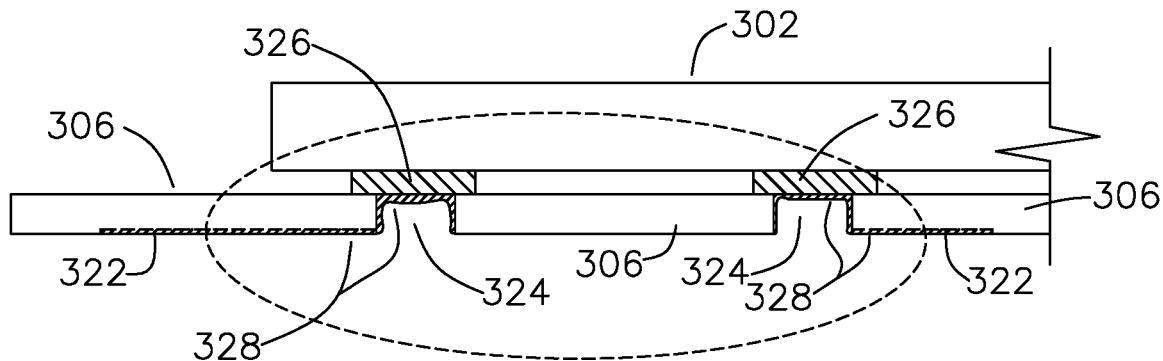
FIG. 3B shows a side view of FIG. 3A following a subsequent processing step.

FIG. 3B shows the substrate 306 and chip 302 lands 326 after an electroless deposition step, which deposits conductive metal in trace channel 322, aperture 324 walls, and pad 326, thereby forming conductive traces and attachments to chip 302 pads 326. In another example of the invention, BGA balls may be positioned below the apertures 324 after electroless plating, with or without channels 322 or associated channel traces.

Figure 4:
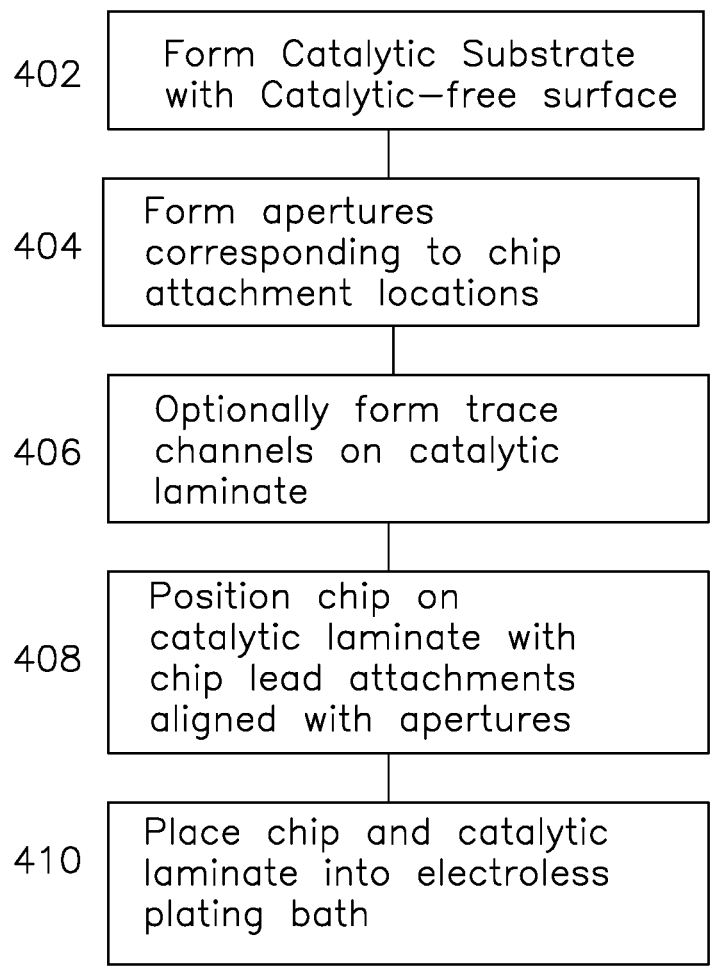
FIG. 4 shows a flowchart with the steps of the process.

FIG. 4 shows example process steps for performing electrical connectivity to substrate channels and chip lands. Step 402 relates to forming the catalytic substrate, which is described in U.S. patent Ser. No. 15/240,133 filed Aug. 18, 2016, which is incorporated by reference. A catalytic substrate of step 402 comprises a variable thickness substrate, which may have one or more layers of woven fiber such as fiberglass which provides mechanical strength and flexibility, the fiberglass infused with a catalytic resin formed from a resin mixed with catalytic particles less than 25 u in longest dimension, and with a mean catalytic particle spacing on the order of a catalytic particle maximum length, for example 25 u or less. The process of forming the catalytic substrate includes a critical process step of holding the pressure and temperature at the gel point of the catalytic laminate (with the solid and liquid resin in equilibrium for a gel point duration time) sufficient for the catalytic particles to migrate away from the outer surfaces of the catalytic laminate so that no surface mask is required to prevent electroless plating in native surface areas that have not been removed. In this manner, the outer surfaces of the catalytic laminate are free of exposed catalytic particles, and the outer surface of the catalytic laminate must be removed (to a depth of at least the catalytic exclusion zone of approximately ½ the catalytic particle dimension) in order for the catalytic laminate to enable electroless deposition.

Process step 404 provides for the formation of apertures 324 of FIG. 3A in the catalytic laminate. Step 406 is the optional step of forming trace channels into the catalytic laminate such as channel 322 of FIG. 3A. After the attachment apertures and trace channels are formed in the catalytic laminate, the chip is positioned on a surface of the catalytic laminate in step 408 with the chip pads aligned to the apertures in the catalytic laminate. Trace channels may be formed in either the top or the bottom surface of the catalytic laminate 306, however traces are usually not positioned in regions directly between the chip 302 and substrate 306, as the chip 302 would inhibit the electroless deposition in channels concealed by the chip adjacent to (below) any substrate 302 channels. In step 410, the chip 302 and substrate 306 are positioned together, optionally bonded to each other, and placed into an electroless plating tank, which forms the conductors deposited into the trace channels, apertures, and chip pads.

FIG. 5 shows another embodiment of the invention, where a multi-layer board 502 with a catalytic laminate is bonded to chip 302 pads 326. The multi-layer board 502 may be fabricated many different ways prior to the bonding operation, for example PCB 502 may be formed from a series of catalytic laminates, each subjected to electroless plating, such as any of the several techniques for fabricating a multi-layer board described in U.S. patent application Ser. No. 15/240,133 filed Aug. 18, 2016. In a final step, via 516 and apertures 512 may be drilled through the board, chip 302 attached as was previously described, and a final electroless plating step performed which provides the outer electroless plating 514, which electrically connects the pads 326 to the multi-layer circuit board 502, and also provides the outer trace layers of PCB 502.

FIG. 6A shows a bottom view of an integrated circuit 604 with electrical attachment lands 602 which are formed on an outer metallization layer. Integrated circuit 604 typically comprises individual transistors and other individual devices formed by the doping of semiconductor material to form devices, with the individual devices interconnected by alternating layers of metallization layers and insulating layers. The metallization layers and devices are formed through a series of patterning steps, the doping steps performed by ion implantation and metallization layers formed by patterned vapor deposition of conductive materials such as aluminum or gold. In another example, the integrated circuit 604 is a semiconductor device such as a high power field effect transistor (FET), or other device having a small number of electrical lands 602 on a relatively large die 604. The integrated circuit lands 602 are typically formed on the final outer layer of metallization. The land metallization is typically the same material as the inner metallization layers, such as aluminum (Al), or in some cases gold (Au). FIG. 6A-1 shows a side view of the integrated circuit 604 of FIG. 6A.

In one example of the invention, the integrated circuit lands 602 are flash plated with a transition material such as nickel which is seeded with catalytic particles, or the catalytic particles are added after the nickel flash step, which provides a scaffold for subsequent electroless plating, as will be described.

FIG. 6B shows a bottom view after a catalytic adhesive 606 material has been applied to integrated circuit 604, such as by rolling, spraying, or any other application method. The catalytic adhesive 604 comprises a mixture of catalytic particles and resin, is cured at a gel temperature for a duration of time sufficient for the catalytic particles to withdrawal to an exclusion zone such as 12 u from the surface of the surface of the catalytic adhesive. In one example of the invention, the surface exclusion zone is ½ of the longest dimension of a catalytic particles, which is smaller than 25 u. After application and curing of the catalytic adhesive 606, the surface is free of catalytic particles, as previously described for the catalytic laminate, and the lands 602 are isolated underneath the catalytic adhesive 606 until subsequent operations are performed.

Figure 6C:
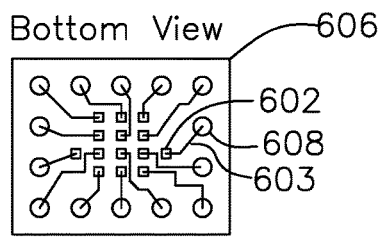
Figures 1, 6C:
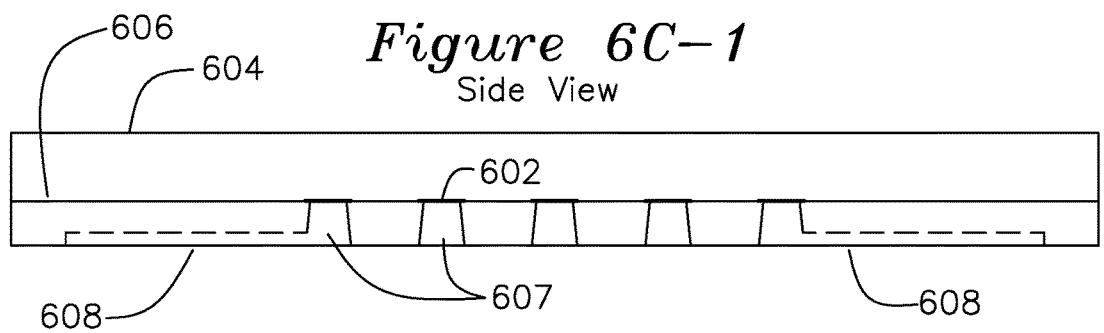

FIG. 6C shows a subsequent step, where a series of deep apertures 607 are formed which penetrate through the catalytic adhesive 606 to the integrated circuit 604 lands 602, as well as a series of shallow channels 603 and shallow lead attachments 608. FIG. 6C-1 shows a magnified side view section of FIG. 6, where integrated circuit 604 and catalytic adhesive 606 are shown, as well as channels 608 and deep apertures 607 which penetrate the full thickness of the catalytic adhesive 606 to the lands 602 of integrated circuit 604. Prior to the surface removal which formed channels 608, pads, and apertures 607, the catalytic particles of the catalytic adhesive 606 were maintained an exclusion zone below the surface by the curing and baking process at the time the catalytic adhesive was first formed. As the channels 603, leads 608, and apertures 602 all extend below the catalytic particle surface exclusion zone formed by the earlier curing process, the inner surfaces of the channels and apertures provide catalytic particles suitable for promoting electroless plating. As was described previously, the integrated circuit lands 602 may be flashed with nickel and then flashed with copper, or the lands 602 may be coated with a catalytic material such that the lands 602 attract copper ions in solution in the same manner as the channels and apertures of the catalytic adhesive.

Figure 6D:
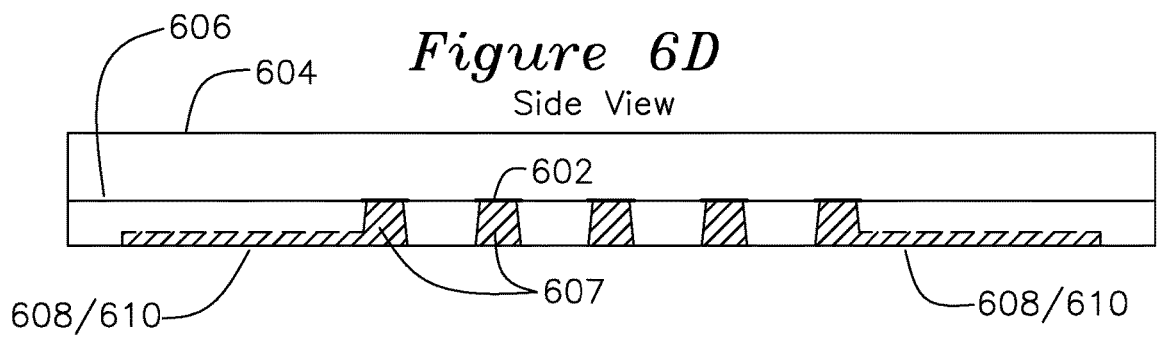
FIGS. 6D and 6E show side views of an integrated circuit after successive steps of the process.

FIG. 6D shows a subsequent step in the process, where the device of FIG. 6C-1 is placed into an electroless plating bath, and a conductive material such as copper is deposited 610 into the channels 608 and apertures 607 to form interconnecting conductive traces.

Figure 6E:
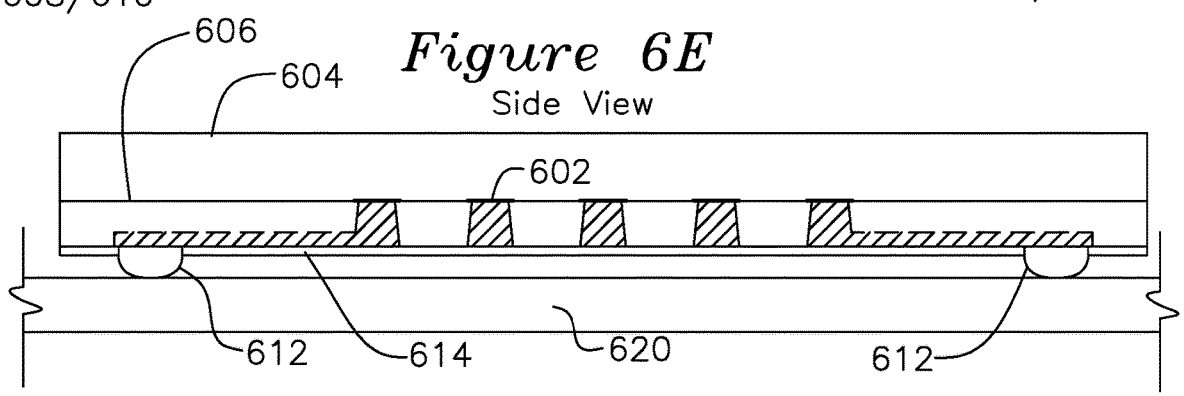

FIG. 6E shows two optional final post-processing steps, where a mask layer 614 may be added to isolate copper filled channels 610 from traces which may be in proximity of a printed circuit board 620. For BGA mounting, balls 612 may be positioned on the terminal sites for use in future surface mount soldering operations. Alternatively, the invention may be practiced without lateral traces on a surface layer, such that the balls 612 may be positioned directly below aperture 607 after electroless plating, with or without interconnecting traces or channels 608/610.

Figure 7:
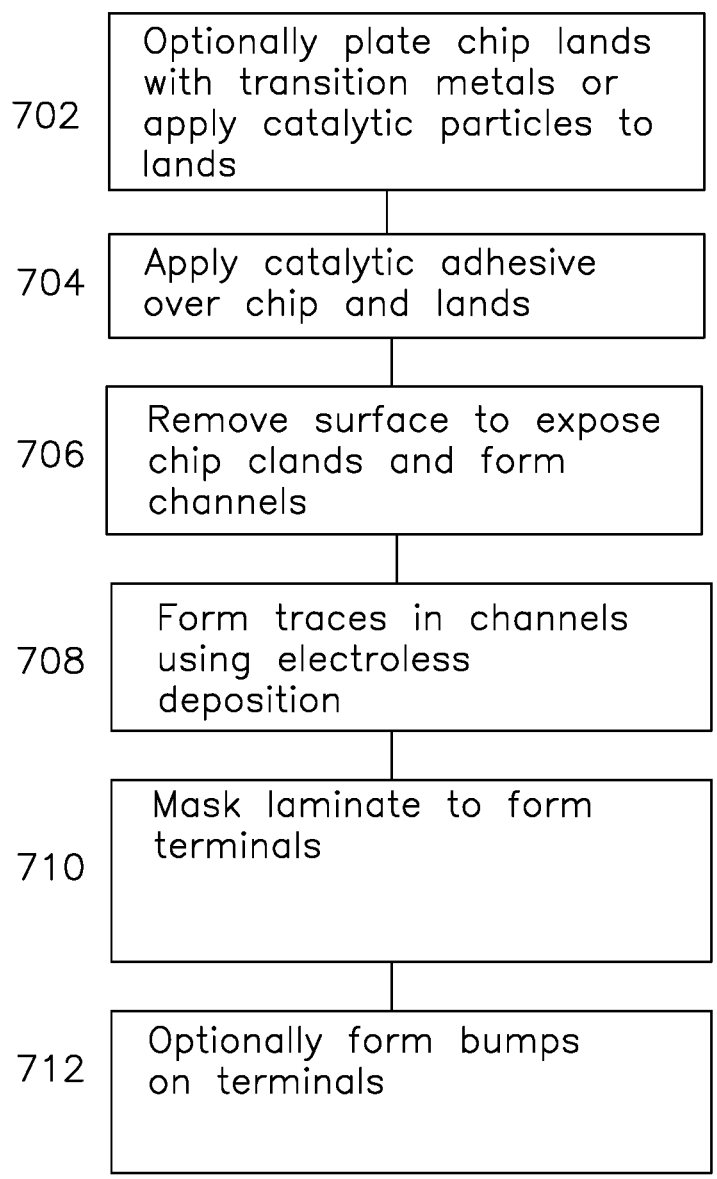
FIG. 7 shows a flowchart of process steps.

FIG. 7 shows a flowchart for a process which provides the device of FIG. 6 through 6E according to the present invention. In steps 702 and 704, the conductive pads or lands of the IC or chip are plated to provide compatibility with the electroless plating process. For example, if the final metallization layer and I/O, power, and ground lands are aluminum, one example deposition would be a nickel flash plating which includes exposed catalytic particles of step 704. Alternatively, a nickel plating layer could be applied over the aluminum metallization lands, and either catalytic particles to form sites of electroless plating, or a copper plating layer to continuously electroless plate, for the case of copper as the electroless plating material. Either treatment of catalytic particles or a compatible plating layer in the aperture regions would provide satisfactory connectivity through electroless plating. Step 706 relates to the formation of apertures such as 607 and trace channels such as 608 of FIG. 6C-1. Step 708 provides the electroless copper deposition resulting in the traces 610 shown in FIG. 6D, and steps 710 and 712 provide the optional mask 614 and the BGA balls 612 of FIG. 6E.

Figure 8A:
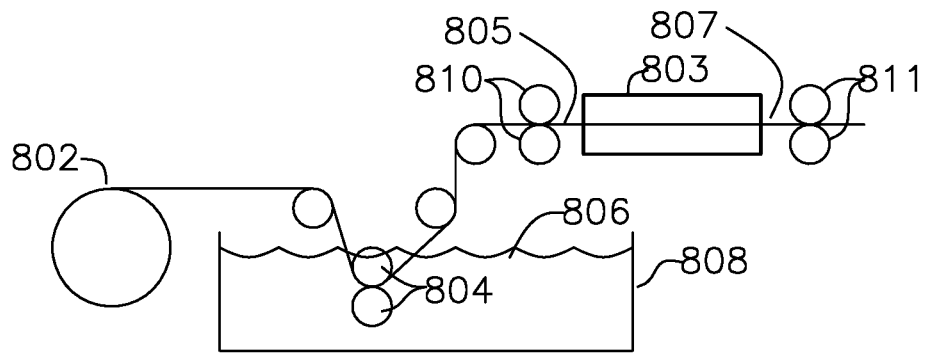
FIG. 8A shows a process for forming catalytic pre-preg.

The catalytic laminate and catalytic adhesive of the present invention may be formed several ways. FIG. 8A shows an example process for fabricating pre-preg (a matrix of pre-impregnated fibers bound in resin). Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon®) blend resin, or other resins. One aspect of the invention is a printed circuit board laminate capable of supporting fine pitch conductive traces on the order of 1 mil (25 u), and while the description is drawn to the formation of copper traces using catalysts for electroless copper formation, it is understood that the scope of the invention may be extended to other metals suitable for electroless plating and electro-plating. For electroless deposition of copper (Cu) channels, elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, it is known in the art that other catalysts for attracting copper ions may also be used. In one example of the invention, the catalytic particles are homogeneous catalytic particles. In another example of the invention, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide (SiO2), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: BrPd, $CL_2Pd$, $Pd(CN)_2$, $I_2Pd$, $Pd(NO_3)_2 \cdot 2H_2O$, $Pd(NO_3)_2$, $PdSO_4$, $Pd(NH_3)4Br_2$, $Pd(NH_3)4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers). In one example of the invention, the composition of catalytic powder is a blended range of catalytic particles (palladium or other active catalyst) mixed with inorganic fillers, with the remainder being resin (by weight). The blended range includes 5% active catalytic particles with 18% inorganic filler (in 77% resin by weight) to 13% catalytic particles with 13% inorganic fillers (in 74% resin by weight) in corresponding ranges. Ordinarily, increasing the ratio of inorganic filler reduces the catalytic particle ratio requirement, but the 5% to 13% active catalytic particle range and 13% to 18% inorganic filler particle ranges represent exemplar ranges, other concentrations may be used without limitation to the operation of the invention.

Among the catalysts, palladium is a preferred catalyst because of comparative economy, availability, and mechanical properties, but other catalysts may be used.

FIG. 8A shows the formation of catalytic laminate, where a roll of fabric cloth 802 such as woven glass fiber is fed through as set of rollers which guide the fabric into tank 808 which is filled with an epoxy resin blended with catalytic particles and mixed with a volatile liquid to reduce the viscosity, thereby forming an A-stage (liquid) pre-preg.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant $\varepsilon$ (permittivity), which is often approximately 4 and governs the characteristic impedance of a transmission line formed on the dielectric, and loss tangent $\delta$, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller. These are example catalytic particle type and size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings. In another example, the catalytic resin mixture 806 is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 5-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

Figure 8B:
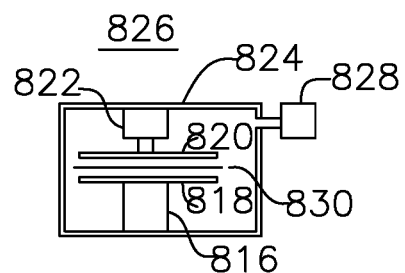
FIGS. 8B and 8C show lamination presses for forming catalytic pre-preg.

After the fabric is immersed into the catalytic resin bath 806 with rollers 804, the catalytic resin impregnated cloth is guided to rollers 810, which establish the thickness of the uncured liquid A-stage pre-preg 805 which also establishes the percentage of resin in the resin/glass+resin ratio. The A-stage pre-preg 805 is then passed through a baking oven 803 which drives out the organics and other volatile compounds of the A-stage pre-preg and greatly reduces the liquid content, forming tack-free B-stage pre-preg 807 delivered by rollers 811. In an example embodiment, oven 803 dries the volatile compounds from an about 80% solvent ratio of A-stage pre-preg to less than about 0.1% solvent ratio for B-stage pre-preg. The resulting B-stage pre-preg 807 is provided to material handling 811 and can be cut into sheets for ease of handling and storage, and is later placed into the lamination press 826 of FIG. 8B which applies pressure across the surface of the sheets under vacuum, changing the temperature profile while the pre-preg core is in the lamination press, following the temperature plot 902 shown in FIG. 9. In one example of the invention, to create the resin rich surface, the pre-preg sheets positioned near the outer surfaces (which will later have the surface removed to expose the underlying catalytic particles) are selected to have greater than 65% resin, such as Glass 106 (71% resin), Glass 1067, or Glass 1035 (65% resin), and the inner pre-preg sheets (which are not subject to surface removal) are selected to have less than 65% resin. Additionally, to reduce the likelihood of fiberglass being present near the surface of the catalytic pre-preg, a woven fiberglass may be used with the inner pre-preg layers and a flat unwoven fiberglass may be used in the outer resin rich pre-preg layers. The combination of resin-rich pre-preg and flat unwoven fiberglass on the outer surface layer results in an exclusion zone of 0.7 mil (17 u) to 0.9 mil (23 u) between an outer surface and the encapsulated fiberglass. Glass styles 106, 1035, and 1067 are preferred for use on the outer resin rich surface since the glass fiber thicknesses are smaller (1.3-1.4 mil/33-35 u) than the glass fiber thickness found in typical pre-preg sheets with greater than 65% resin used in the central regions of the laminate, such as glass style 2116, which has 3.7 mil (94 u) fibers. These values are given as examples, the smallest glass fibers which are commercially available are expected to continue to reduce in diameter. The temperature vs. time plot 902 is tailored in the present invention to cause the catalytic particles and fiberglass to migrate away from the outer surface of the laminate, repelled by the surface tension of the epoxy during a liquid state of the gel point temperature. After the cooling cycle of plot 902, the cured C-stage pre-preg sheets are offloaded 814. The process which forms the cured C-stage pre-preg sheets may use single or multiple sheets of fiber fabric to vary the finished thickness, which may vary from 2 mil (51 u) to 60 mil (1.5 mm).

Figure 8C:
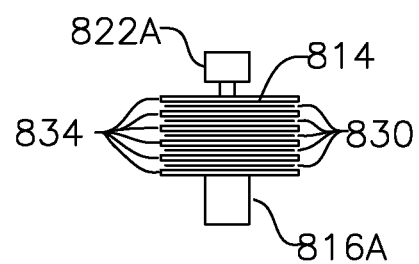
Figure 10:
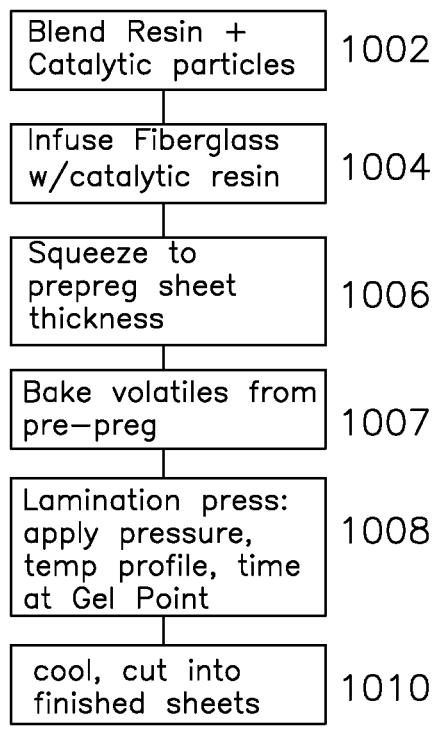
FIG. 10 is a process flowchart for forming catalytic pre-preg.

FIG. 10 shows a flowchart for the process of making pre-preg laminate with catalytic particles infused but excluded from the outer surface of the pre-preg. Step 1002 is the blending of catalytic particles into the resin, often with an organic volatile added to lower the mixture viscosity, which forms the catalytic resin 806 placed in reservoir 808. Step 1004 is the infusion of catalytic resin into the fabric such as rollers 804 of FIG. 8 may provide to form A-stage pre-preg, and step 1006 is the initial rolling of catalytic resin infused fabric into B-stage pre-preg such as by rollers 810, step 1007 is a baking step for removing organic solvents to form B-stage pre-preg, and step 1008 is the pressing of catalytic resin infused fabric 830 into sheets of catalytic C-stage pre-preg in lamination press 826, which follows the temperature cycle of plot 902, with vacuum pump 828 evacuating chamber 824 throughout the lamination process to remove air bubbles from the epoxy and reduce any air voids that may form in the epoxy. The cooled finished catalytic C-stage pre-preg sheets are cut and stored for later use.

Figure 9:
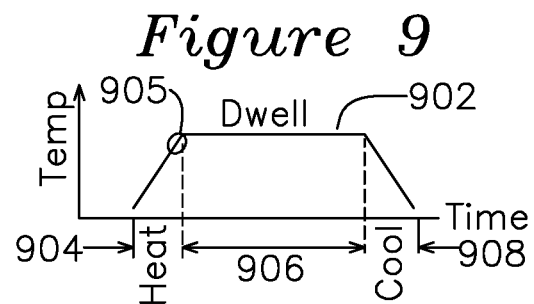
FIG. 9 is a plot for time and temperature to form a catalytic laminate which excludes catalytic particles in an exclusion zone at and below the surface.

The FIG. 9 plot 902 of temperature vs. time shows the temperature profile of the pre-preg in the lamination press 812, which is critical for the formation of a catalytic pre-preg which has surface property of catalytic particles being excluded from the outer resin rich surface, but which are present just below the outer resin rich surface. The resin is in liquid state in reservoir 808, and the pre-preg is in in an A-stage after the resin is impregnated into the fiberglass and passes through rollers 810. The pre-preg is in a B-stage after baking 8010 where the volatile organics are baked off accompanied by an initial resin hardening, which converts the B-stage pre-preg into becomes C-stage pre-preg at the end of the lamination cycle, such as the cooling phase of FIG. 9. The B-stage pre-preg is placed into the lamination press and a vacuum is pulled to prevent trapped air from forming between lamination layers. Heat is applied during a temperature ramp-up time 904 to achieve a temperature and pressure determined pre-preg gel point 905 for a duration on the order of 10-15 seconds (the gel point defined as the state where the liquid and solid states are close to equilibrium with each other), which is critical for the process of migrating the catalytic particles away from the surface, after which the temperature of the pre-preg is maintained at the dwell temperature and dwell time 906 which may be in the range of 60-90 minutes, followed by a cooling cycle 908. The dwell temperature and gel point temperature are pressure and resin dependent, in the example range of 120 C (for epoxy) to 350 C (for Teflon/polyimide resins). Maintaining the pre-preg at the gel point 905 for too short of a duration will result in the catalytic particles or fiberglass being undesirably present at the surface of the finished pre-preg.

Figure 11:
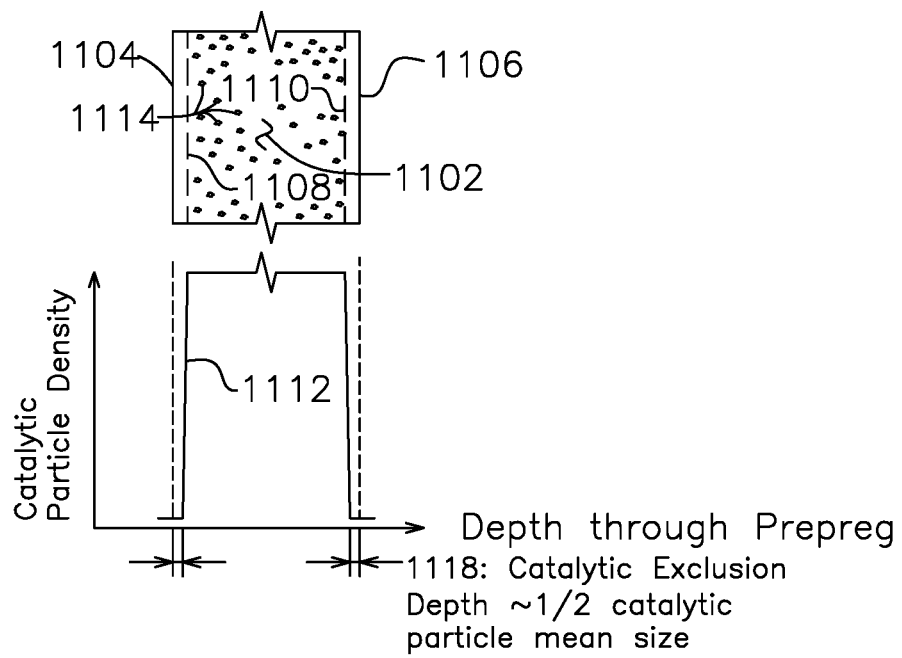
FIG. 11 shows a side section view of catalytic laminate with a corresponding plot showing density of catalytic particles through the section.

FIG. 11 shows the resultant catalytic pre-preg 1102 formed by the process of FIGS. 8A, 8B, 8C, 9, and 10, where the catalytic particles 1114 are distributed uniformly within the central region of pre-preg 1102, but are not present below a boundary region 1108 below first surface 1104, or below boundary region 1110 below second surface 1106. For the example particle distribution of particles smaller than 25 u, the catalytic particle boundary is typically 10-12 u below the surface (on the order of half of the particle size), accordingly this depth or greater of surface material must be removed for the embedded catalytic particles to be available for electroless plating.

Prior art catalytic laminates have activated surfaces that must be masked to prevent unwanted electroless plating on the activated surface of the catalytic laminate. By contrast, the catalytic laminate of the present invention excludes catalytic particles over the thickness extent from first surface 1104 to first boundary 1108, and from second surface 1106 to second boundary 1110, providing the benefit that a separate mask layer preventing contact with the catalytic particles is not required for electroless plating as it is in the prior art. Accordingly, removal of surface material from either first surface 1104 to the depth of boundary layer 1108 or deeper, or removal of surface material from second surface 1106 to second boundary 1110, results in the exposure of catalytic material which may be used for electroless plating. It is also desirable for the process which provides the resin rich surface to also exclude not only catalyst, but the fiber fabric, as removal of the surface layer in subsequent steps which results in the exposure of fibers requires additional cleaning steps, accordingly it is preferred that the surface removal be of resin only, so as to expose the underlying catalytic particles. This is accomplished by using a combination of resin-rich outer pre-preg layers and flat unwoven fiberglass layers having smaller diameter fibers on the outside layers. An additional advantage of forming traces in channels using electroless plating is that the traces are mechanically supported on three sides, which provides greatly improved trace adhesion to the dielectric laminate.

The present invention relies on the removal of surface material to expose the underlying catalytic particles. There are many ways of performing this surface removal to the level of the exclusion depth. The removal of surface material may be by laser ablation, where the temperature of the catalytic pre-preg is instantly elevated until the catalytic pre-preg is vaporized, while leaving the surrounding pre-preg structurally unchanged, leaving the catalytic particles exposed. It may be preferable to use a laser with a wavelength with a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam extent and high available power which for forming channels of precise mechanical depth and with well-defined sidewalls. An example laser may remove material in a 0.9-1.1 mil (23 u to 28 u) diameter width with a depth governed by laser power and speed of movement across the surface. Another surface removal technique for forming channels and apertures is plasma etching, which may be done locally or by preparing the surface with a patterned mask which excludes the plasma from the surface layers, such as a dry film photoresist or other mask material which has a low etch rate compared to the etch rate of catalytic pre-preg. The photoresist thickness is typically chosen based on epoxy/photoresist etch selectivity (such that plasma etch to the desired depth of removal of the cured epoxy leaves sufficient photoresist at the end of the etch), or in the case of photoresist which is used as an electroplate mask, the thickness is chosen according to desired deposition thickness. Typical dry film thickness is in the range of 0.8-2.5 mil (20-64 u). Plasmas suitable for etching the resin rich surface include mixtures of oxygen (O) and CF$_4$ plasmas, mixed with inert gasses such as nitrogen (N), or argon (Ar) may be added as carrier gasses for the reactive gases. A mask pattern may also be formed with a dry film mask, metal mask, or any other type of mask having apertures. Where a mechanical mask is used, the etch resist may be applied using any of photolithography, screen printing, stenciling, squeegee, or any method of application of etch resist. Another method for removal of the surface layer of pre-preg is mechanical grinding, such as a linear or rotational cutting tool. In this example, the pre-preg may be secured in a vacuum plate chuck, and a rotating cutter (or fixed cutter with movable vacuum plate) may travel a pattern defining the traces such as defined by x,y coordinate pairs of a Gerber format photofile. In another example of removing surface material, a water cutting tool may be used, where a water jet with abrasive particles entrained in the stream may impinge on the surface, thereby removing material below the first exclusion depth boundary. Any of these methods may be used separately or in combination to remove surface material and form channel in a catalytic prepreg, preferably with the channel extending below the exclusion depth boundary. Accordingly, the minimum channel depth is the depth required to expose the underlying catalytic particles, which is a characteristic of the cured pre-preg. As the catalytic material is dispersed uniformly through the cured pre-preg below the exclusion boundary, the maximum channel depth is limited by the depth of the woven fiber (such as fiberglass) fabric, which tends to complicate channel cleaning, as the fibers may break off and re-deposit in channels intended for electroless plating, or otherwise interfere with subsequent process steps. Typical channel depths are 1 mil (25 u) to 2 mil (70 u). The final step after removing the surface material to form the channel is to clean away any particles of material which were removed, which may be accomplished using ultrasound cleaning, jets of water mixed with surfactant, or any other cleaning means which does not result in surface material surrounding the channel from being removed.

One example electroless copper bath formulation uses a mixture of Rochelle salt as the complexing agent, copper sulfate as the copper metal source, formaldehyde as the reducing agent, and sodium hydroxide as a reactant. In this example, the tartrate (Rochelle salt) bath is preferred for ease of waste treatment; the Rochelle salt does not chelate as strongly as alternatives such as EDTA or quadrol. In this example, the tartrate (Rochelle salt) is the completing agent, copper sulfate is the metal source, formaldehyde is the reducing agent, and sodium hydroxide is a reactant. Other electroless plating formulations are possible, this example is given for reference. The electroless plating initially forms over the surfaces of the exposed catalytic particles. The copper deposition progresses as the electroless plating continues until the channel and aperture are filled, optionally above the surface of the catalytic laminate. Alternatively, the electroless plating may be stopped when the conductor trace is continuous and sufficiently thick to resist mechanical shock or other environmental factors which may fracture the trace, as is known in the art of electroless plating.

A key advantage of electroless plating with channels etched in catalytic material is that the electroless plating progresses on all three sides at once, compared to electroplating which only progresses from the bottom (initially plated) layer.

If necessary, it may be desirable to planarize the surface after electroless plating, if the electroless plating provides an uneven surface. Surface smoothing may be accomplished many different ways, for example using a 420 to 1200 grit abrasive applied on a planar surface with mild pressure and linear or rotational agitation between the board and planar surface to provide a grinding operation. Other methods for planarizing the surface may be used, including milling or machining using chemical processes, mechanical processes, or other methods for forming a planar surface.

An advantage of an additive process of the present invention is that for traces formed using a prior art process which etches all of the copper except the desired trace copper, surface contaminates on the surface cause adjacent trace shorting, as a copper bridge remains where the contamination was present on the surface of the copper, which does not occur in additive electroless plating of the present invention.

The catalytic adhesive may be formed as was previously described for the catalytic resin using the ratio of 5-16% catalyst weight to resin weight, with 12% the preferred value. The resulting catalytic adhesive may be applied to the chip substrate and baked to cure the catalytic adhesive. In one application method, the catalytic adhesive is applied to the leading edge of a mechanized squeegee comprising a flexible blade carrying the catalytic adhesive and passing over the surface of the chip, either as individual chip dies sliced from a full wafer, or a full wafer, with the pressure and spacing between the flexible blade and the chip or wafer adjusted for a desired thickness of catalytic laminate uniformly disposed on the surface of the chip in a single pass of the squeegee. A typical catalytic adhesive thickness is 12-75 u thick. The catalytic adhesive thickness should be at least 2× thicker than the largest catalytic particles, to ensure that the catalytic particle remains below the surface of the catalytic adhesive.

The preceding description is only to provide examples of the invention for understanding the underlying mechanisms and structures used, and is not intended to limit the scope of the invention to only the particular methods or structures shown. For example, the sequences of FIGS. 6C-1, 6D, 6E show a single sided construction with the trace channels cut on a lower surface only and a chip on an upper surface only, whereas the same structures and methods can be applied to the opposite surface without loss of generality, as the electroless plating step can be applied to channels or exposed catalyst on both sides of the board in a single step. Additionally, the trace layer 606 may be formed as individual layers which are subsequently laminated together into a single board with mixed layers of catalytic pre-preg and non-catalytic pre-preg, and the apertures drilled in a final step for electroless plating of the chip or chips to the board on one or both sides. Accordingly, a catalytic substrate should be understood to include a "multilayer catalytic substrate" to include such constructions In the present specification, "approximately" is understood to mean less than a factor of 4 greater or smaller, "substantially" is understood to mean less than a factor of 2 greater or smaller. "Order of magnitude" of a value includes the range from 0.1 time the values to 10 times the value.

The proceeding has been a description of the preferred embodiment of the invention. It will be appreciated that deviations and modifications can be made without departing from the scope of the invention, which is defined by appended claims.

We claim:

1. An integrated circuit device comprising:
   an integrated circuit having electrical lands on a first surface;

said integrated circuit first surface having a catalytic adhesive applied thereby forming a second surface of said catalytic adhesive above said integrated circuit first surface, said catalytic adhesive comprising catalytic particles dispersed in a resin, said catalytic particles and said resin cured such that said catalytic particles are disposed an exclusion depth below said second surface, said catalytic adhesive thereby having a lower density of catalytic particles in a region from said second surface to said exclusion depth than other regions of said catalytic adhesive;

a plurality of apertures formed in said catalytic adhesive, at least one said aperture located adjacent to at least one said electrical contact of said integrated circuit;

a plurality of channels formed onto said second surface, at least one said channel extending from an aperture to a terminal land on said catalytic adhesive second surface;

said plurality of channels, said plurality of apertures, and at least one said integrated circuit land having exposed catalytic particles such that a conductor is formed by electroless deposition of copper which interconnects at least one said integrated circuit land, at least one said channel, and a channel terminus on said second surface.

2. The integrated circuit device of claim 1 where said catalytic adhesive is formed from catalytic particles comprising at least one of: palladium (Pd), platinum (Pt), rhodium (Rh), iridium (Ir), nickel (Ni), gold (Au), silver (Ag), cobalt (Co), or copper (Cu), or other compounds or salts thereof.

3. The integrated circuit device of claim 1 where said catalytic particles comprise a filler coated with a catalyst, and said filler is at least one of: a clay mineral, a hydrous aluminum phyllosilicate, silicon dioxide, kaolinite, polysilicate, a member of the kaolin or china clay family, or a high temperature plastic.

4. The integrated circuit device of claim 1 where said exclusion depth is approximately ½ the length of the longest dimension of a catalytic particle.

5. The integrated circuit device of claim 1 where said catalytic adhesive comprises a resin mixed with catalytic particles where the ratio of said catalytic particles to said resin by weight is in the range 5% to 16%, and where said catalytic adhesive is cured at a gel point temperature for a gel point dwell time sufficient to cause the catalytic particles to migrate below an exclusion depth below the surface of the catalytic adhesive.

6. The integrated circuit device of claim 1 where said catalytic adhesive contains at least one of an epoxy resin, polyimide resin, cyanate ester resin, or a Polytetrafluoroethylene (PTFE) blend resin.

7. The integrated circuit device of claim 1 where said apertures are formed by laser ablation.

8. The integrated circuit device of claim 1 where at least one said land of said integrated circuit has a layer of transition metal compatible with electroless plating, where said layer of transition metal has exposed catalytic particles or said layer of transition metal is formed from copper.

9. A process for forming an integrated circuit device, the process operative on an integrated circuit chip having electrically conductive lands on a first surface, the first surface coated with a catalytic adhesive thereby forming a second surface above the first surface, said second surface having a reduced density of catalytic particles in a region extending from said second surface to an exclusion depth below said second surface compared to other regions of the catalytic adhesive, the process comprising:

applying a catalytic adhesive to an integrated circuit chip;

curing the catalytic adhesive;

forming apertures into the catalytic adhesive in locations corresponding to integrated circuit lands, said apertures thereby exposing said catalytic particles of said catalytic adhesive and said integrated circuit lands;

forming channels in the catalytic laminate to a depth below the exclusion depth and leading to said apertures and also to optional connection regions on said second surface;

performing an electroless plating operation until said channels and apertures are in electrical contact with said integrated circuit lands and said optional connection regions.

10. The process of claim 9 where said electroless plating is copper and said catalyst is palladium.

11. The process of claim 9 where said integrated circuit lands are either formed from copper, or are formed from nickel flash with a surface deposition of copper or catalytic particles.

12. The process of claim 9 where said catalytic adhesive has catalytic particles mixed with inorganic fillers.

13. The process of claim 9 where said catalytic adhesive has a concentration by weight in the range of 5% to 16% catalytic particles which are an exclusion depth below said first surface or said second surface of the catalytic adhesive.

14. The process of claim 9 where said catalytic adhesive has in the range of 5% to 13% of active catalytic particles with a corresponding range of 18% to 13% inorganic filler particles.

15. A process for forming an integrated circuit package, the process operative on an integrated circuit with conductive lands, the process comprising:

applying a catalytic adhesive to a surface of the integrated circuit, said catalytic adhesive having catalytic particles below an exclusion depth;

forming apertures in said catalytic adhesive adjacent to said conductive lands;

forming device leads in the catalytic adhesive;

forming channels having a depth greater than the exclusion depth in the adhesive which interconnect at least one said integrated circuit land to at least one device terminal;

electroless plating said integrated circuit package, thereby connecting said device terminals and said at least one integrated circuit conductive land.

16. The process of claim 15 where said catalytic adhesive includes catalytic particles less than 25 u in longest dimension and said catalytic particles are in the range of 5% to 16% by weight.

17. The process of claim 15 where said catalytic adhesive contains at least one of: a resin, woven or unwoven glass fiber, palladium (Pd), platinum (Pt), rhodium (Rh), iridium (Ir), nickel (Ni), gold (Au), silver (Ag), cobalt (Co), or copper (Cu), or other compounds or salts thereof.

* * * * *